US006819116B2

(12) United States Patent
Ishibashi et al.

(10) Patent No.: US 6,819,116 B2
(45) Date of Patent: Nov. 16, 2004

(54) TERMINAL CRIMPED STATE TESTING METHOD

(75) Inventors: Teruyuki Ishibashi, Shizuoka (JP); Kazuyoshi Tomikawa, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 23 days.

(21) Appl. No.: 10/079,401

(22) Filed: Feb. 22, 2002

(65) Prior Publication Data

US 2002/0130669 A1 Sep. 19, 2002

(30) Foreign Application Priority Data

Mar. 19, 2001 (JP) ........................................ 2001-078662
Jun. 15, 2001 (JP) ........................................ 2001-181461

(51) Int. Cl.[7] .......................... H01H 31/04; H01R 43/04
(52) U.S. Cl. ........................... 324/538; 72/21.4; 29/748; 29/861
(58) Field of Search ......................... 324/538; 439/877; 29/747, 748, 753, 761, 859, 861; 72/20.1, 19.8, 21.4

(56) References Cited

U.S. PATENT DOCUMENTS

| 4,812,138 A | * | 3/1989 | Kondo et al. ................ 439/865 |
| 5,197,186 A | * | 3/1993 | Strong et al. ................. 29/753 |
| 5,727,409 A | * | 3/1998 | Inoue et al. ................... 29/753 |
| 5,937,505 A | * | 8/1999 | Strong et al. ................. 29/593 |

FOREIGN PATENT DOCUMENTS

JP            1-185457         7/1989

* cited by examiner

Primary Examiner—Anjan Deb
Assistant Examiner—Timothy J. Dole
(74) Attorney, Agent, or Firm—Armstrong, Kratz, Quintos, Hanson & Brooks, LLP

(57) ABSTRACT

In a terminal crimped state testing method, in step S1, a reference waveform is created on the basis of a load when a terminal in a good crimped state is obtained, and the reference waveform is divided into plural reference waveform segments to set singular points. In step S2, the reference waveform segments containing singular points of the segments are integrated. In step S3, a characteristic waveform is created on the basis of the load when a crimping terminal to be tested is obtained. The characteristic waveform thus created is divided into plural sample waveform segments and the waveform segments corresponding to the reference waveform segments are integrated. In step S4, the integrated values of the reference waveform segments are compared with those of the sample waveform segments, thereby deciding whether the crimped state of the crimping terminal is good or not. In this configuration, the terminal crimped state can be stably tested, the defectiveness is precisely detected, and the time taken for testing can be shortened.

10 Claims, 12 Drawing Sheets

TERMINAL CRIMPED STATE TESTING METHOD

BACKGROUND OF THE INVENTION

1. Field of the Invention

This invention relates to a terminal crimping device for making a terminal-equipped wire which constitutes a wire harness, and more particularly to a terminal crimped state testing method for testing the crimped state of the terminal crimped by the terminal crimping device.

2. Description of the Related Art

In order to attach a terminal to an electric wire, a terminal crimping device has been used traditionally. As regards the electric wire, before the terminal is attached to it, the coated portion such as its end is removed to expose the core at the end. Namely, the electric wire is subjected to a scraping operation. The above terminal is provided with a core caulking leg for caulking the exposed core and an electric wire caulking leg for caulking the electric wire for each coated portion.

Traditionally, the terminal has been crimped on the electric wire in such a way that the core caulking leg and the electric wire caulking legs are caulked by the terminal crimping device. As the case may be, during the crimping step, poor crimping occurs. In order to detect the poor crimping of the crimped terminal, a poor crimping detecting device is employed.

This device tests the terminal-equipped wire whether or not it is poor by comparing the characteristic waveform obtained by sampling the characteristic values during the crimping step in time sequence with a reference waveform which is the characteristic waveform previously acquired for a good terminal-equipped wire. This is based on the fact that the characteristic value (load) during the abnormal crimping varies in a different manner from that during the normal crimping, i.e. the acquired characteristic curve is different from the reference waveform.

An example of the poor crimping detecting device is disclosed in JP-A-185457. This poor crimping detecting device tests the terminal-equipped wire whether it is good or not by comparing the integrated value over the time of sampling the characteristic curve with the integrated value of the reference waveform when the terminal-equipped wire is obtained from the normal crimping.

However, there is the degree of a difference in a waveform between the reference waveform and the characteristic waveform according to the degree of poorness. For example, if the electric wire is not scraped at a required position and the coated portion is caulked by the core caulking leg, the acquired characteristic waveform is much different from the reference waveform. Further, also where the core cut at a scraping position is caulked by the core caulking leg, the acquired characteristic waveform is much different from the reference waveform. In these cases where the degree of poorness is high, whether or not the crimped state of the crimping terminal is good or not can be easily decided. However, if there is a small difference between the reference waveform and the characteristic waveform, it is difficult to decide whether the crimped wire is good or not.

In the poor crimping detecting method-disclosed in JP-A-185457, severe poorness, which provides a large difference in the integrated value, can be easily detected. However, the poorness, which provides the characteristic waveform which is higher than the reference waveform at an initial time of the crimping and lower at a terminating time thereof, is difficult to create a difference in the integrated value. This makes it difficult to decide whether or not the crimped electric wire is good or not.

The decision whether or not the crimped state of the terminal is good is made during the step of crimping the terminal on the wire. This requires the time taken for the operation to be shortened.

As described above, the terminal is provided with the core caulking leg and the electric wire caulking leg. These legs are caulked simultaneously by the terminal crimping device. Therefore, if poor crimping occurs, it was difficult to identify a singular point.

SUMMARY OF THE INVENTION

An object of this invention is to provide a terminal crimped state detecting device which can stably decide whether or not the crimped state is good, surely detect slight poorness and shorten the time required for the decision.

In accordance with this invention, there is provided a method for testing the crimped state of a terminal on the basis of a waveform of the characteristic values obtained in the process of crimping the terminal on a core of an electric wire, comprising the steps of: acquiring a reference waveform from the characteristic waveform when the terminal has been crimped normally, and dividing the reference waveform into first plural reference waveform segments; dividing a characteristic waveform obtained when a terminal to be tested is crimped on the electric wire into a plural segments corresponding to those of the reference waveform; and deciding whether or not the crimped state of the terminal is good on the basis of the first reference waveform segments of the reference waveform and the waveform segments of the characteristic waveform.

In accordance with the method as described above, since the crimped state of the terminal is tested on the basis of a part of the characteristic waveform divided into waveform segments, whether or not the crimped state of the terminal is good is stably decided, thereby detecting the poor crimping precisely. Incidentally, a part of the characteristic waveform used for decision is preferably a region where a difference in the characteristic value is shown remarkably according to whether or not the crimped state is good.

On the basis of a part of the divided waveform segments of the characteristic waveform, whether or not the crimped state is good is decided. This shortens the time required for decision. Incidentally, the characteristic waveform preferably exhibits the load applied to the terminal when it is deformed during the crimping operation or the displacement of a crimping apparatus which is used for crimping. The reference waveform segment and sample waveform segment which are used for decision on whether or not the crimped state is good are preferably selected according to the terminal and electric wire.

In the method as described above, preferably, singular points of the reference waveform are previously acquired on the basis of increments of the reference waveform; and the first reference waveform segments contain the singular points.

In accordance with the method described above, since a part of the reference waveform segments which is used for decision contains singular points, in the case of the terminal in which the load value at a singular point and its vicinity varies according to whether or not the crimped state is good, the poor crimping can be detected more precisely. Incidentally, a part of the characteristic waveform used for decision is preferably a region where the characteristic value greatly varies according to whether or not the crimped state is good.

The singular points are preferably points where the pair of caulking legs of the crimping terminal are brought into contact with each other in the course during which they are deformed in the process of crimping by the terminal crimping device, where the pair of caulking legs of the crimping terminal start to come in contact with the core, and the load starts to rise, where in the course of caulking the core, the load turns from "rise" into "fall", where the load reaches the peak and hence is not still applied.

In the method described above, preferably, singular points of the reference waveform are previously acquired on the basis of increments of the reference waveform; and the first reference waveform segments are located between the singular points.

In accordance with the method described above, since a part of the reference waveform segments used for decision is located between the singular points, in the case of the terminal where the easiness (or difficulty) of deformation, i.e. load value varies between the singular points according to whether the crimping state is good or not, the poor crimping can be surely and precisely detected. Incidentally, a part of the characteristic waveform used for decision is preferably a region where the characteristic value greatly varies according to whether or not the crimped state is good. Further, during the crimping operation of the terminal, the terminal is mainly deformed between the singular points.

The singular points are preferably points where the pair of caulking legs of the crimping terminal are brought into contact with each other in the course during which they are deformed in the process of crimping by the terminal crimping device, where the pair of caulking legs of the crimping terminal start to come in contact with the core, and the load starts to rise, where in the course of caulking the core, the increment of the load turns from "rise" into "fall", where the load reaches the peak and hence is not still applied.

In accordance with this invention, there is also provided a method for testing the crimped state of a terminal on the basis of a waveform of the characteristic values obtained in the process of crimping the terminal on a core of an electric wire, characterized by comprising the steps of: acquiring a reference waveform from the characteristic waveform when the terminal has been crimped normally; acquiring singular points of the reference waveform on the basis of the increments thereof; acquiring second reference waveform segments which are segments containing the singular points; acquiring second waveform segments containing the points corresponding to the singular points in the characteristic waveform obtained when the terminal to be tested has been crimped on the electric wire; and deciding whether or not the crimped state of the terminal is good on the basis of the second reference waveform segments and the second waveform segments.

In accordance with the method described above, a part of the second reference waveform segments used for decision contains singular points, and the second waveform segments of the characteristic waveform to be tested contain the segments corresponding to the singular points. Where or not the crimped state of the terminal is good is decided on the basis of the second reference waveform segments and the second sample waveform segments. Therefore, in the case of the terminal in which the load values at the singular points and their vicinity vary according to whether or not the crimped state is good, the poor crimping can be detected more precisely. Incidentally, a part of the characteristic waveform used for decision is preferably a region where the characteristic value greatly varies according to whether or not the crimped state is good.

Whether or not the crimped state is decided on the basis of the second reference waveform segments which are a part of the reference waveform and the second sample waveform segments which are a part of the characteristic waveform. This shortens the time taken for decision.

Incidentally, the characteristic waveform preferably exhibits the load applied to the terminal when it is deformed during the crimping operation or the displacement of a crimping apparatus which is used for crimping. The singular points are preferably points where the pair of caulking legs of the crimping terminal are brought into contact with each other in the course during which they are deformed in the process of crimping by the terminal crimping device, where the pair of caulking legs of the crimping terminal start to come in contact with the core, and the load starts to rise, where in the course of caulking the core, the increment of the load turns from "rise" into "fall", where the load reaches the peak and hence is not still applied.

In the method as described above, preferably, the singular points are points where the increment of the reference waveform is maximum or zero.

In accordance with the method described above, the singular points, which are points where the increment of the reference waveform is maximum or zero, are points where the pair of caulking legs of the crimping terminal are brought into contact with each other in the course during which they are deformed in the process of crimping by the terminal crimping device, where the pair of caulking legs of the crimping terminal start to come in contact with the core, and the load starts to rise, where in the course of caulking the core, the increment of the load turns from "rise" into "fall", where the load reaches the peak and hence is not still applied. This permits the poor crimping to be detected more surely and more precisely.

In accordance with this invention, there is also provided a method for testing the crimped state of a terminal on the basis of a waveform of the characteristic values obtained in the process of crimping the terminal on a core of an electric wire, characterized by comprising the steps of:
acquiring a reference waveform from the characteristic waveform when the terminal has been crimped normally, and acquiring reference characteristic values at regular intervals of the reference waveform; acquiring the characteristic values of the characteristic waveform obtained when the terminal to be tested has been crimped on the electric wire, at the regular intervals; and deciding whether or not the crimped state of the terminal is good on the reference characteristic values and the characteristic values.

In accordance with the method described above, since the crimped state of the terminal is decided on the basis of the characteristic values at regular intervals of the characteristic waveform, whether or not the crimped state of the terminal is good can be stably decided, thereby permitting the poor crimping more precisely.

Since whether or not the crimped state is good is decided on the characteristic values at regular intervals of the characteristic waveform, the time taken for decision can be shortened. Incidentally, the characteristic waveform is preferably the load applied to the terminal when it is deformed during the crimping operation or the displacement of a crimping apparatus which is used for crimping.

In the method described above, preferably, the electric wire has a coating for coating the core, the terminal has caulking legs for caulking the core, a first poorness waveform is acquired from the waveform when the calking legs caulk the coating as well as the core, and a first singular point of the singular points is acquired from the reference waveform and the first poorness waveform.

In accordance with the method described above, the first singular point is acquired from the first poorness waveform when the calking legs caulk the coating as well as the core and the reference waveform when normally crimped. This permits the first singular point to be defined surely defined.

In the method as described above, preferably, the first singular point is defined by a point where the characteristic value of the first poorness waveform exceeds that of the reference waveform as the time of a crimping operation elapses.

In accordance with the method described above, the first singular point is defined by a point where the characteristic value of the first poorness waveform exceeds that of the reference waveform. This permits the first singular point to be surely defined.

In the method as described above, preferably, the core is composed of a plurality of conductors tied up in a bundle; the terminal has caulking legs for caulking the core; a second poorness waveform is acquired from the characteristic waveform when the caulking legs caulk conductors whose number is smaller than that when the terminal has been normally crimped; and a second singular point is acquired from the reference waveform and the second poorness waveform.

In accordance with the method as described above, the second singular point is defined by a second poorness waveform when the caulking legs caulk conductors whose number is smaller than that when the terminal has been normally crimped and the reference waveform when normally crimped. This permits the second singular point to be surely defined.

In the method as described above, preferably, the second singular point is defined by a point where the characteristic value of the first poorness waveform falls below that of the reference waveform as the time of a crimping operation elapses.

In the method described above, preferably, the second singular point is defined by a second poorness waveform when the caulking legs caulk conductors whose number is smaller than that when the terminal has been normally crimped and the reference waveform when normally crimped. This permits the second singular point to be surely defined.

In accordance with the method described above, the second singular point is defined by a point where the characteristic value of the first poorness waveform falls below that of the reference waveform. This permits the second singular point to be surely defined.

The above and other objects and features of this invention will be more apparent from the following description taken in conjunction with the accompanying drawings.

BRIEDF DESCRIPTION OF THE DRAWINGS

DESCRIPTION OF THE PREFERRED EMBODIMENS

Embodiment 1

Figure 1:
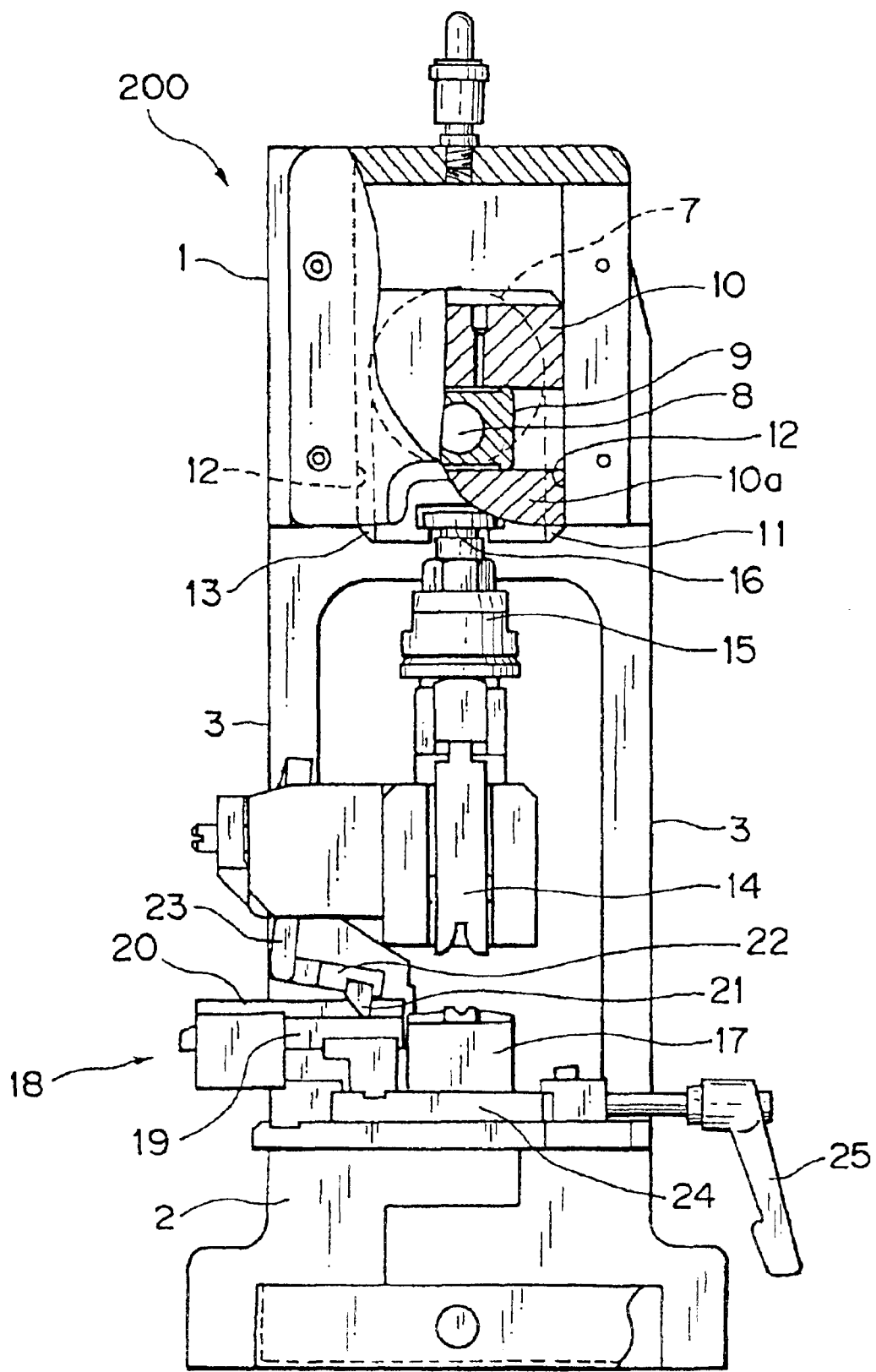
FIG. 1 is a front view of a terminal crimping apparatus to which a method for testing a terminal crimped state according to a first embodiment of this invention is applied.
Figure 2:
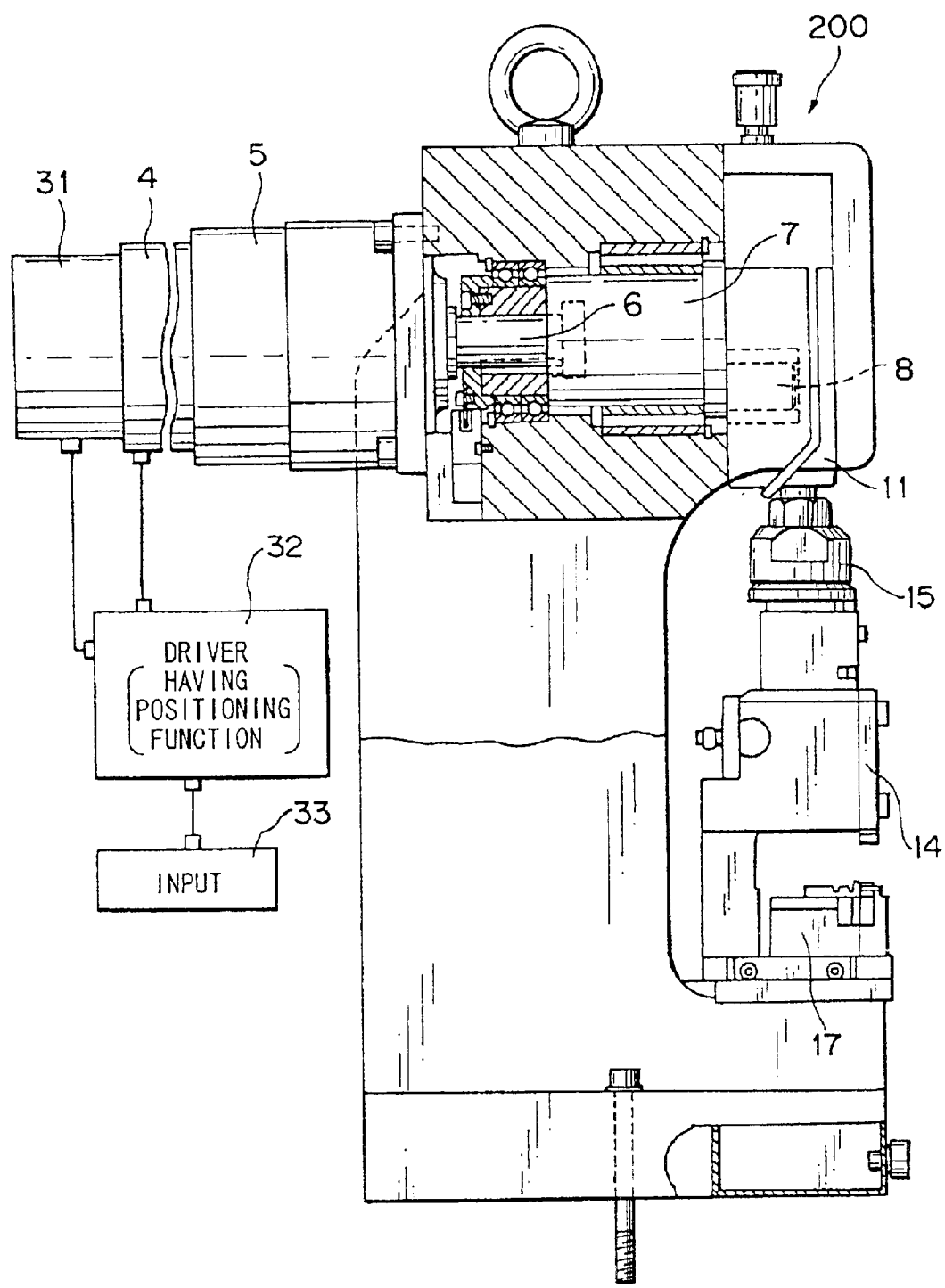
FIG. 2 is a side view of the terminal crimping apparatus shown in FIG. 1.
Figure 3:
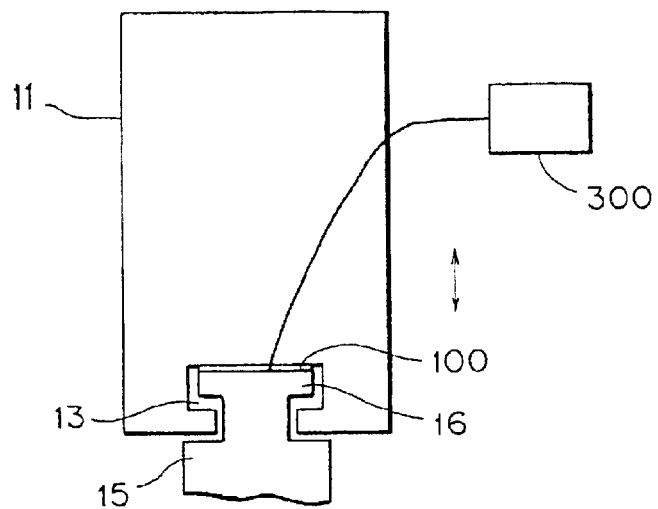
FIG. 3 is a view showing the state where a pressure sensor is attached in the first embodiment.
Figure 15:
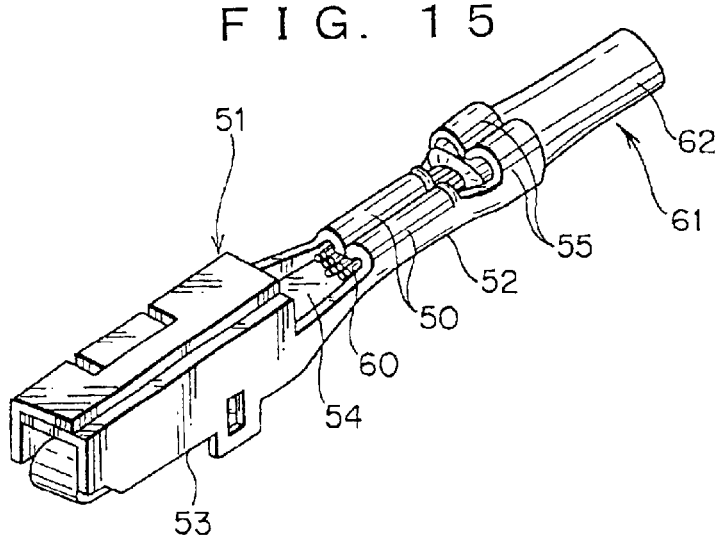
FIG. 15 is a perspective view of an electric wire and a crimping terminal attached to each other using the terminal crimping apparatus.

Now referring to FIGS. 1 to 8 and 15, an explanation will be given of a first embodiment of this invention. FIG. 1 is a front view of the terminal crimping device to which the invention is applied. FIG. 2 is a side view of the terminal crimping device shown in FIG. 1. A terminal crimping device 200 shown in FIGS. 1 and 2 serves to crimp an crimping terminal 51 on an electric wire 61 as shown in FIG. 15.

The electric wire 61 includes a conductive core 60 and an insulating coating 62 which coats the core 60. The core 60 is a strand of a plurality of conductors, and its section is round. The conductors of the core 60 are made of conductive metal such as copper, copper alloy, aluminum or aluminum alloy. The coating 62 is made of insulating synthetic resin. Before a crimping terminal 51 is crimped on the electric wire 61, the coating of the electric wire 61 is partially removed so that the core 60 is partially exposed.

The crimping terminal 51 is formed by bending a conductive metallic plate. The crimping terminal 51 is a female terminal with an electric contact 53 (described later) formed cylindrically. The crimping terminal 51 includes an electric wire connecting portion 52 to be connected to the electric wire 61, an electric contact 53 to be connected to other terminal metal fittings and a bottom wall 54 which connects the electric wire connecting portion 52 and the electric wire contact portion 53.

The electric wire connection portion 52 includes a pair of electric wire caulking legs 55 and a pair of core caulking legs 50. The pair of electric wire legs 55 extend upright from both edges of the bottom wall 54. The electric wire caulking legs 55 are further bent toward the bottom wall 54 to sandwich the coating 62 of the electric wire 61 between itself and the bottom wall 54. Thus, the pair of electric wire caulking legs 55 caulks the coating of the electric wire 61.

The pair of core caulking legs 50 extend upright from both edges of the bottom wall 54. The core caulking legs are further bent toward the bottom wall 54 to sandwich the exposed core 60 between itself and the bottom wall 54. Thus, the pair of core caulking legs 50 caulk the core 60. The terminal crimping device 200 serve to bend the caulking legs 50 and 55 toward the bottom wall 54 to crimp the crimping terminal 51 on the electric wire 61. In FIG. 1, a frame 1 of the terminal crimping device 200 includes a base plate 2 and side plates 3, 3 on both sides.

A servo motor 4 provided with a decelerator 5 is fixed to the upper rear portion of both side plates 3, 3. A disk 7 having an eccentric pin (crank shaft) 8 is axially provided around the output shaft 6 of the decelerator 5. A slide block 9 is pivotally attached to the eccentric pin 8. The slide block 9 is slidably mounted between seats 10 and 10a attached to a ram 11. The slide block 9 slides horizontally between the seats 10 and 10a by rotation of the disk 7 and the ram 11 moves vertically.

The ram 11 is mounted on ram guides 12, 12 formed on the inner faces of both side plates 3, 3 so that they are vertically slidable. The disk 7, slide block 9, seats 10, 10a, ram 11 and ram guide 12 constitute a piston-crank mechanism. The ram 11 has an engaging concave portion 13 at the lower end. An engaging convex portion 16 of the crimper holder 15 equipped with a crimper 14 is removably mounted in the engaging concave portion 13.

The crimper 14 is opposite to an anvil 17. The anvil 17 is secured to an anvil mounting stand 24 on a base plate 2. A pressure sensor 100 is provided between the ram 11 and the crimper holder 15. The pressure sensor 100 is connected to a poor crimping detecting device 300. The poor crimping detecting device 300 serves to detect the vertical load (hereinafter referred to as a load value) from the crimper 14 on the basis of the output from the pressure sensor 100. The detected load value is processed as a characteristic value in the course of crimping. Incidentally, it should be noted that the load serves as counter force from the crimping terminal 51 and force to be applied to the crimping terminal 51.

In FIG. 1, reference numeral 18 denotes a terminal supplying device having a known configuration. The terminal supplying device 18 includes a terminal guide 19 for supporting crimping terminals 51 coupled like a chain (not shown), a terminal presser 20, a terminal carrying arm 22 having a terminal carrying pallet 21 at a tip, a swinging link 23 for moving the arm 22, etc.

The swinging link 23 swings to and fro as the ram 11 descends or ascends so that the terminal carrying pallet 21 sends the crimping terminals 51 onto the anvil 17 one by one. The anvil 17 is adapted so that its alignment with the crimper 14 and removal or replacement can be easily done.

The servo motor 4 rotates reversibly so that the ram 11, i.e. crimper 14 ascends or descends through the piston-crank mechanism. The servo motor 4 is connected to a driver 32 for controlling the driving of the servo motor 4. As the crimper 14 descends or ascends, the crimping terminal 51 is crimped on the electric wire 61 between the crimper 14 and anvil 17.

An input unit 33 is connected to a driver 32. The input unit 33 is adapted to input the reference data such as the standard (or size) of the crimping terminal 51, size of the corresponding electric wire 61, crimper height, load (current) exerted on the servo motor 4. An encoder 31 is attached to the output shaft (not shown) of the servo motor 4. On the basis of its number of revolutions, the position of the crimper 14 is detected and fed back to the driver 32.

Figure 4:
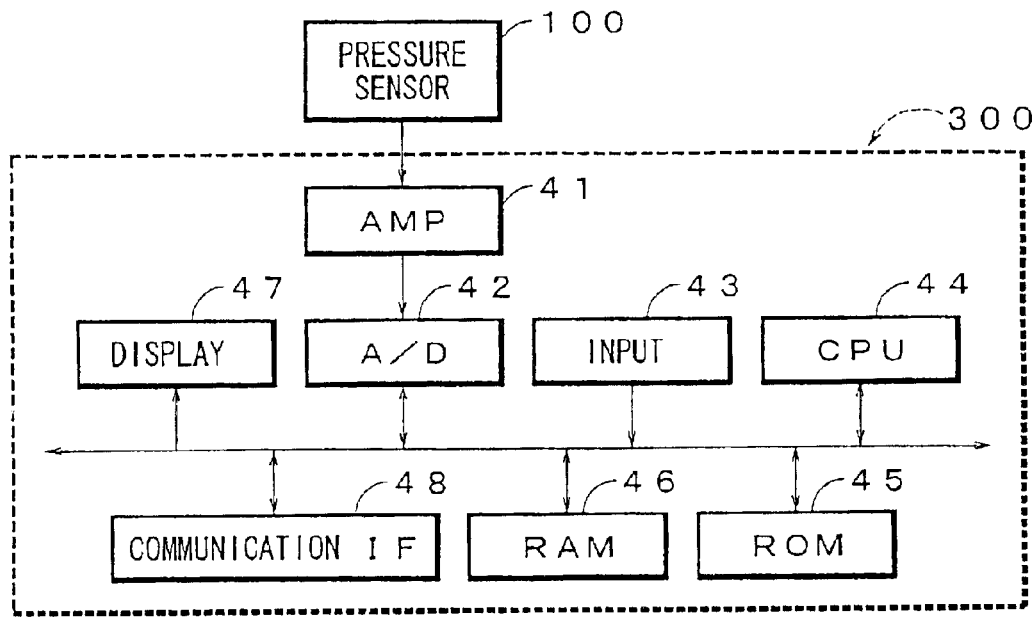
FIG. 4 is a block diagram of a device for detecting the poorness of crimping in the first embodiment.

FIG. 4 is a block diagram of the poor crimping detecting device 300 according to this embodiment. The poor-crimping detecting device 300 includes an amplifier 41 for amplifying the output from the pressure sensor 100, an A-D converter 42 for converting an analog voltage signal produced from the amplifier 41 into a digital voltage data, an input unit 43, CPU 44, ROM 45, RAM 46, display unit 47 and a communication interface 48.

The input unit 43, CPU 44, ROM 45, RAM 46, display unit 47 and communication interface 48 constitute a microcomputer. The CPU 44 performs a control operation using a working area of the RAM 46 on the control program stored in the ROM 45.

Specifically, the data from the A/D converter 42, which corresponds to the load value obtained through the pressure sensor, is sampled as a characteristic value. The CPU 44 performs the operation on the basis of the characteristic value thus sampled and performs processing of creating a reference waveform 71 (shown in FIG. 5 and others), processing of dividing the reference waveform 71 into reference waveform segments, processing of detecting a singular point on the reference waveform 71, processing of integrating reference waveform segments 72a, 72b, 72c and 72d (described later), processing of inputting a threshold value and acceptable limit, processing of detecting poor crimping, etc. The results thereof are displayed on the display unit 47.

Figure 5A:
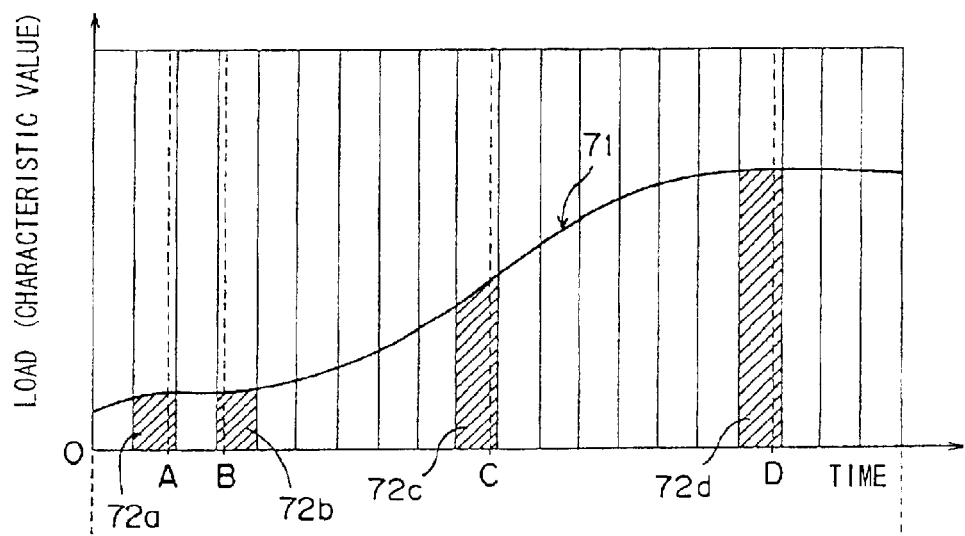
FIGS. 5A and 5B are graphs showing a reference waveform, an increment waveform, singular points and first reference waveform segments in the first embodiment.

When the crimping terminal 51 is crimped, the characteristic value, which is the data of the load value acquired through the pressure sensor 100, is obtained so that the characteristic waveform 71 as shown in FIG. 5A is obtained. The characteristic waveform 71 represents a change in the load value with the passage of time. The waveform shown in FIG. 5A is waveform when the crimping has been normally effected. A plurality of waveforms when the crimping has been normally effected are acquired and stored in a prescribed format in the RAM 46. Incidentally, the characteristic waveform 71 is hereinafter referred to as a reference waveform 71.

Whenever the digital data is determined in a prescribed conversion cycle, the A/D converter 42 produces the data. The CPU 44 can therefore sample the characteristic value in a time series on a time base of the timings of producing the above data. The data of the reference waveform (characteristic waveform) 71 can be stored in the RAM 46 as the data in the time series. By averaging the data of the plurality of characteristic waveforms when the crimping has been normally carried out, the data of the reference waveform 71 is created in the RAM 46.

In the following description, the word "characteristic waveform" is used in either case where the crimping has normally completed and not normally completed. The word "reference waveform" refers to the characteristic waveform when the crimping has been normally completed.

Once the reference waveform 71 as shown in FIG. 5A has been acquired, the CPU 44 acquires an increment of the characteristic value for each unit time on the basis of the data of the reference waveform 71 to create the data of the waveform 73 of the increments.

On the basis of the data of the waveform 73 of the increments, the positions of an extreme or zero-crossing (position on a time base) are detected. These positions are defined as singular points. In the example illustrated in FIG. 5B, four points of points A, B, C and D are defined as the singular points. The points indicative of the extreme of the increments are also located at the points other than the four points. These four points are peculiar points as described below in the one cycle of the crimping process, and previously known in their approximate positions so that they can be extracted.

The singular points A, B, C and D are points indicative of a maximum increment of the reference waveform 71, their neighboring points, or points indicative of a zero increment and their neighboring points.

Figure 6A:
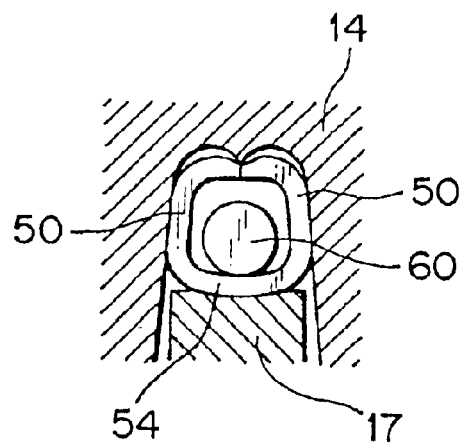
FIGS. 6A to 6E are sectional views showing the process of crimping a crimper, an anvil, a pair of core caulking legs and a core.
Figure 6B:
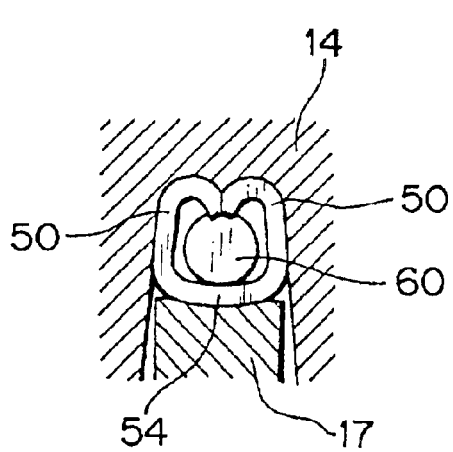
Figure 6C:
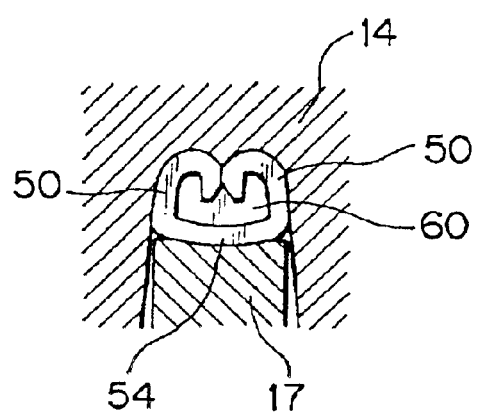
Figure 6D:
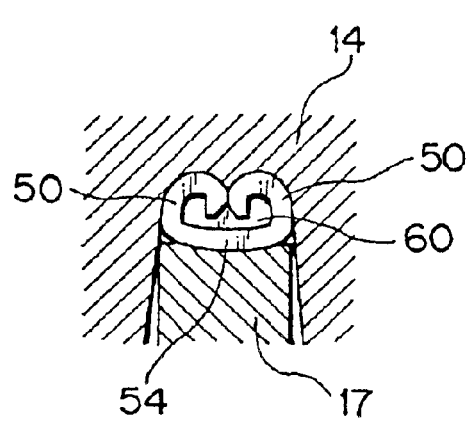
Figure 6E:
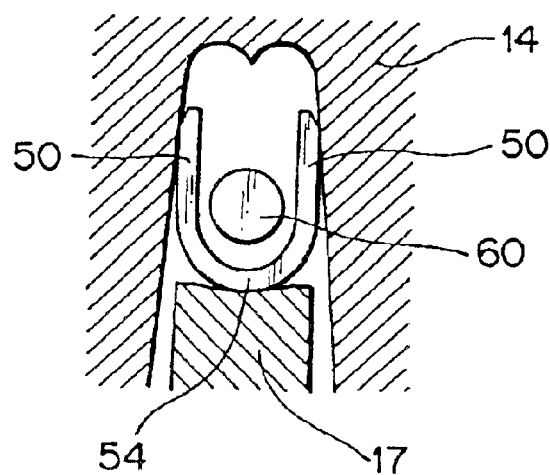

FIGS. 6A to 6E are sectional view of the crimping process relative to a crimper 14, anvil 17, a pair of caulking legs 50 of the crimping terminal 51 and core 60. FIGS. 6A to 6D show the states at the four singular points A, B, C and D, respectively. FIG. 6E shows the state immediately before the crimping is started. The four singular points A, B, C and D are the pints as described below. Incidentally, it should be noted that the singular point A corresponds to the first singular point defined in claims and the singular point B corresponds to the second singular point defined in claims.

Point A: As illustrated in FIG. 6A, the pair of core caulking legs 50 of the crimping terminal 51 are brought into contact with each other in the course during which they are deformed by the R (curved portion) at the upper portion of the crimper.

Point B: As illustrated in FIG. 6B, the pair of core caulking legs 50 of the crimping terminal 51 start to come in contact with the core 60, and the force (load) starts to rise.

Point C:

As illustrated in FIG. 6C, in the course of caulking the core 60 by the pair of core caulking legs 50 of the crimping terminal 51, the increment of the force (load) turns from "rise" into "fall".

Point D:

As illustrated in FIG. 6D, the core 60 is completely caulked by the pair of core caulking legs 50, and the force (load) reaches the peak.

It is needless to say that both the data of the reference waveform 71 and the increment waveform 73 can be dealt with as a time series data in the same time base as the data of the characteristic waveform. Further, the positions of the singular points can be stored as data of the timings correlated with these time series data.

The CPU 44 divides the reference waveform 71 into plural segments and sets the segments containing the above singular points A, B, C and D of these plural segments as reference waveform segments 72a, 72b, 72c and 72d which are shaded. On the basis of the characteristic waveform of each of the reference waveform segments 72a, 72b, 72c and 72d, whether or not the crimped state is good or not is decided. In the illustrated example, the reference waveform 71 is divided into 20 waveform segments at regular time intervals.

When the poor crimping is identified for each of the reference waveform segments 72a, 72b, 72c and 72d, the CPU 44 previously computes the area of each of the reference waveform segments 72a, 72b, 72c and 72d shaded in FIG. 5 while it creates the reference waveform 71 and defines the singular points A, B, C and D.

The CPU 44 creates a characteristic waveform 81 (drawn by one-dot chain line in FIG. 7) as well as the reference waveform 71 described above while the electric wire 61 onto which the crimping terminal 51 to be tested is crimped. The CPU 44 divides the characteristic waveform 81 into plural segments like the reference waveform 71 and computes the areas of the waveform segments 82a, 82b, 82c and 82d corresponding to the reference waveform segments 72a, 72b, 72c and 72d.

Thereafter, the CPU 44 computes differences in the area between the reference waveform segments 72a, 72b, 72c and 72d and the waveform segments 82a, 82b, 82c and 82d (the differences are shaded in FIGS. 7A and 7B), respectively. If at least one of the differences exceeds a prescribed threshold value, it is decided that the crimped state of the crimping terminal is defective. If all the differences are within the prescribed threshold value, it is decided that the crimped state of the crimping terminal is good.

In this way, if decision is made for each of the segments containing the singular points A, B, C and D, the normal crimping (good product) and the abnormal crimping (defective product) can be easily discriminated from each other. In the case of the abnormal crimping of catching the coating 62, as seen from FIG. 7A, the characteristic waveform 81 is higher than the reference waveform 71 between points A and B, and B and C and lower than the reference waveform 71 between points C and D.

Figure 7A:
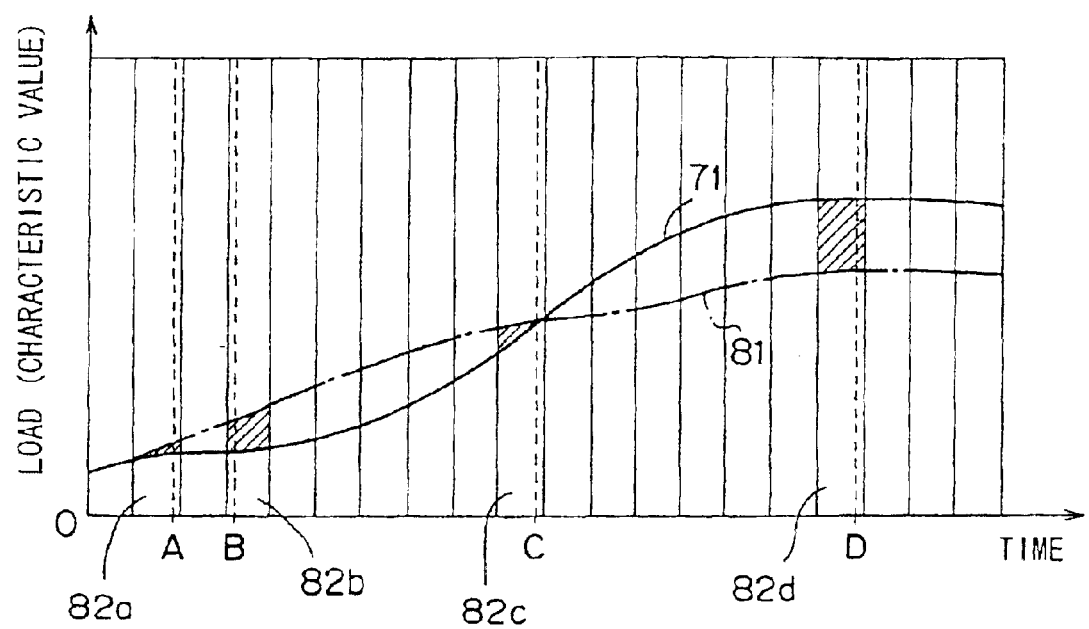
FIGS. 7A and 7B are graphs showing an relationship between the reference waveform and the characteristic waveforms corresponding to different poor states.
Figure 7B:
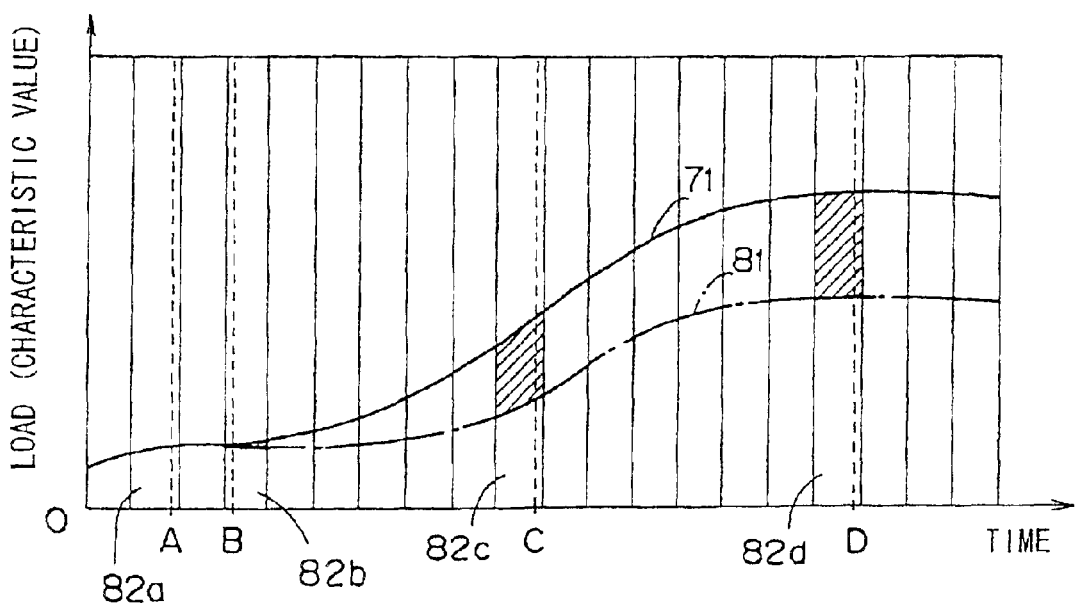

In contrast, in the case of the abnormal crimping where the core 60 has been cut at the scraped position or the amount of wire is insufficient, as seen from FIG. 7B, the characteristic waveform 81 is equal to the reference waveform 71 between points A and B, and is lower than the reference waveform 71 between points B and C and between points C and D.

Thus, since the characteristic waveform for each of the segments containing the singular points A, B, C and D clearly represents the feature of each defectiveness, the capability of poor crimping can be enhanced by investigating the characteristic waveform.

Figure 8:
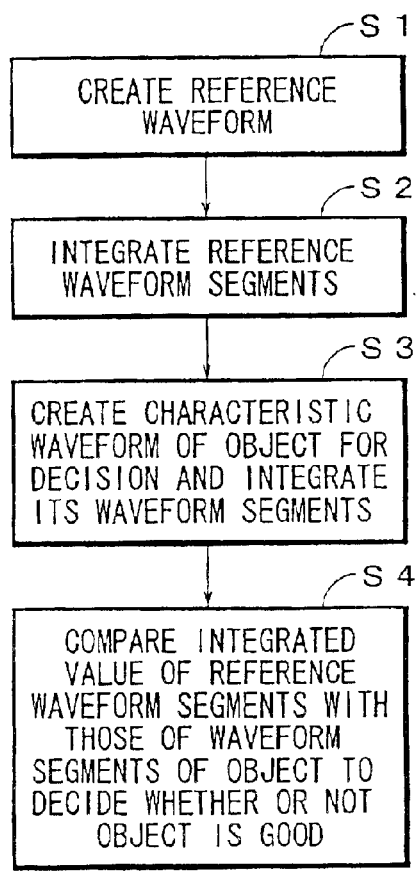
FIG. 8 is a flowchart of an example of a process of deciding the crimped state according to the first embodiment.

Now referring to the flowchart of FIG. 8, an explanation will be given of the process of deciding whether or not the crimped state of the crimping terminal is good or not.

In step S1, the crimping terminal 51 is crimped on the electric wire 61 by the terminal crimping device 200. The electric wire 61 with the crimping terminal 51 crimped thereon in a good condition is created plural times to create a reference waveform 71.

In step S2, the reference waveform 71 is divided into plural waveform segments by the CPU 44. The CPU 44 or an operator sets the singular points A, B, C and D. The CPU 44 integrates the reference waveform segments 72a, 72b, 72c and 72d which are segments containing the singular points A, B, C and D, respectively.

In step S3, the crimping terminal 51 to be tested is crimped on the electric wire 61. Like the reference waveform 71, the characteristic waveform 81 obtained when the electric wire 61 with the crimping terminal 51 crimped thereon is made is divided into the waveform segments. The waveform segments 82a, 82b, 82c and 82d corresponding to the reference waveform segments 72a, 72b, 72c and 72d are integrated.

In step S4, the integrated values (areas) of the reference waveform segments 72a, 72b, 72c and 72d are compared with those of the waveform segments 82a, 82b, 82c and 82d, respectively. If the difference between them exceeds a threshold value, it is decided that the electric wire at issue is a poor product. If the difference between them does not exceed the threshold value, it is decided that the electric wire at issue is a good product.

In accordance with this embodiment, since the crimped state of the crimping terminal 51 is decided on the basis of the characteristic waveform divided into plural waveform segments, the crimped state of the crimping terminal 51 can be decided stably so that the poor crimping can be detected precisely.

In the course where the pair of core caulking legs 50 of the crimping terminal 51 are deformed by the R (curved portion) of the crimper 14, the singular point A is a point where the pair of core caulking legs 50 are brought into contact with each other. The singular point B is a point where the value of the load created when the pair of cores 50 start to touch the core 60 starts to rise. The singular point C is a point where in the course of caulking the core 60, the increment of the load turns from "rise" into "fall". The singular point is a point where the load has reached the peak (no load is applied). In order to decide whether the crimping state of the crimping terminal 51 crimped on the electric wire 61 is good or not, the reference waveform segments 72a, 72b, 72c and 72d containing the singular points A, B, C and D are used. Therefore, while the crimping terminal 51 is crimped, the load can vary at the singular points A, B, C and D and their vicinities according to whether the crimping is satisfactory or not so that the poor crimping can be surely and precisely.

Since the crimping state is tested on the basis of the waveform segments 82a, 82b, 82c and 82d of the characteristic waveform 81 divided into plural segments, the time taken for decision can be shortened.

Embodiment 2

Figure 9:
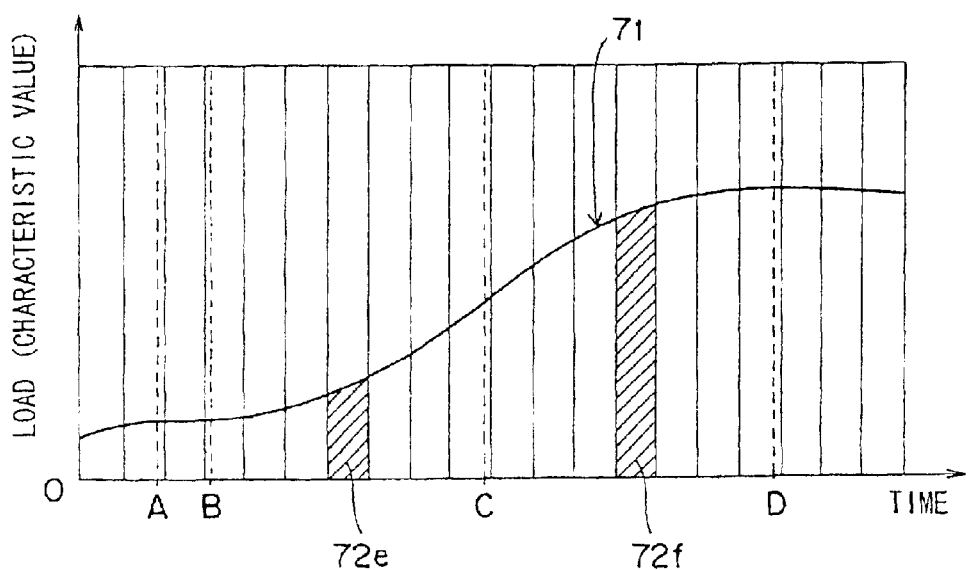
FIG. 9 is a graph showing a reference waveform, singular points and second reference waveform segments in a second embodiment.

Now referring to FIGS. 9 and 10, an explanation will be given of a second embodiment of this invention. Like reference numerals refer to like symbols.

In this embodiment, after the CPU 44 divides the created reference waveform 71 into segments to set the singular points A, B, C and D, it sets a reference waveform segment 72e located between the points B and C, and another reference partial waveform 72f of the segment located between the points C and D. The CPU 44 computes the areas of the reference waveforms 72e and 72f.

Figure 10A:
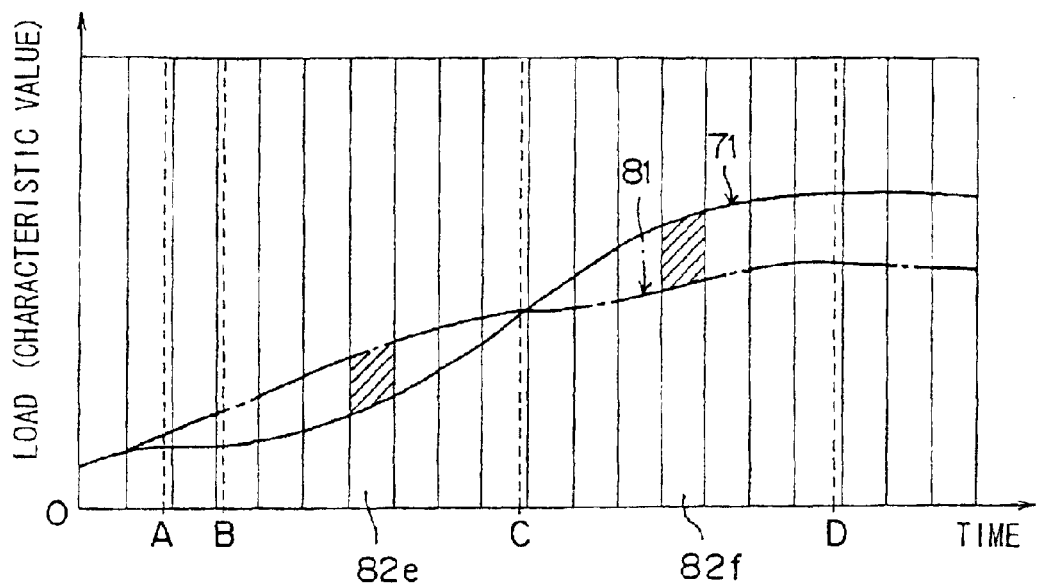
FIGS. 10A and 10B are graphs showing an relationship between the reference waveform and the characteristic waveforms corresponding to different poor states in the second embodiment.
Figure 10B:
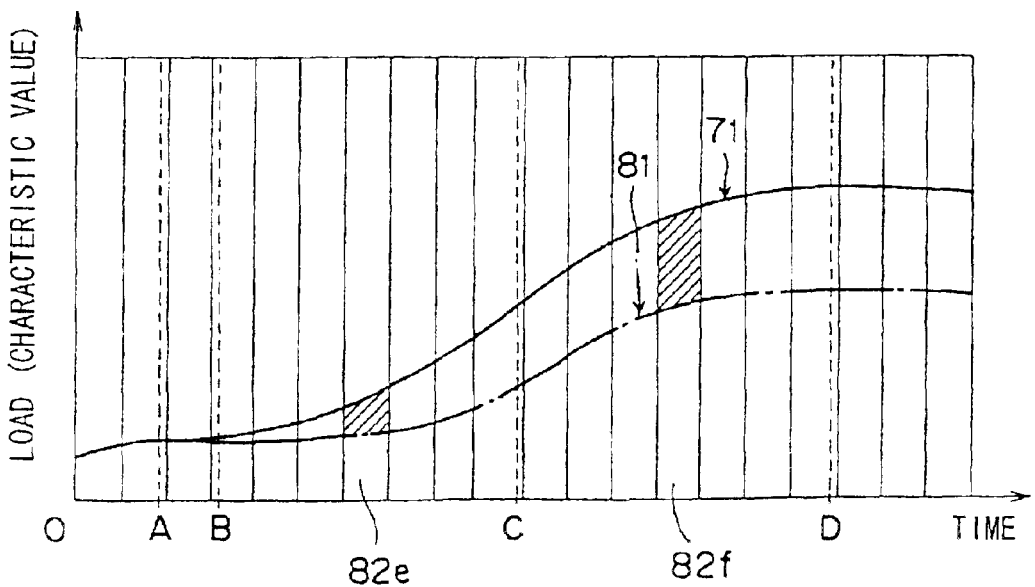

In order to decide whether the crimping state is good or not, the characteristic waveform 81 (illustrated by one-dot chain line in FIG. 10) obtained when the crimping terminal 51 is crimped on the electric wire 61 is divided into waveform segments like the reference waveform 71. Whether the crimping state is good or not is decided on the basis of the differences (shaded portions in FIG. 10) between the areas of the waveform segments 82e and 82f and those of the corresponding waveform segments 72e and 72f. In FIG. 10A, the one-dot chain line represents the abnormal crimping (insulator catching) in which the coating 62 has been caught. In FIG. 10B, the one-dot chain line represents the abnormal crimping (shortage of the core) in which the core 60 has been cut at a scraped position or the amount of wire of the core 60 is less.

In this embodiment also, whether or not the crimped state of the terminal is good or not is decided on the basis of the waveform segments 82e and 82f which are part of the characteristic waveform 81 divided into plural segments. For this reason, the time taken for decision can be shortened.

In the course where the pair of core caulking legs 50 of the crimping terminal 51 are deformed by the R (curved portion) of the crimper 14, the singular point A is a point where the pair of core caulking legs 50 are brought into contact with each other. The singular point B is a point where the value of the load created when the pair of cores 50 start to touch the core 60 starts to rise. The singular point C is a point where in the course of caulking the core 60, the increment of the load turns from "rise" into "fall". The singular point is a point where the load has reached the peak (no load is applied). In order to decide whether or not the crimped state of the crimping terminal 51 crimped on the electric wire 61 is good, the reference waveform segments 72a, 72b, 72c and 72d containing the singular points A, B, C and D are used. Therefore, while the crimping terminal 51 is crimped, the load can vary at the singular points A, B, C and D and their vicinities according to whether the crimping is satisfactory or not so that the poor crimping can be surely and precisely.

Further, while the crimping terminal 51 is crimped, it may be deformed among the singular points A, B, C and D. In this case, the easiness (or difficulty) of deformation, i.e. load value varies according to whether the crimping state is good or not. In this way, where the load varies among the singular points A, B, C and D, the crimping state is decided on the areas of the segments of the characteristic waveform among the singular points A, B, C and D, the poor crimping can be surely and precisely detected.

Embodiment 3

Figure 11A:
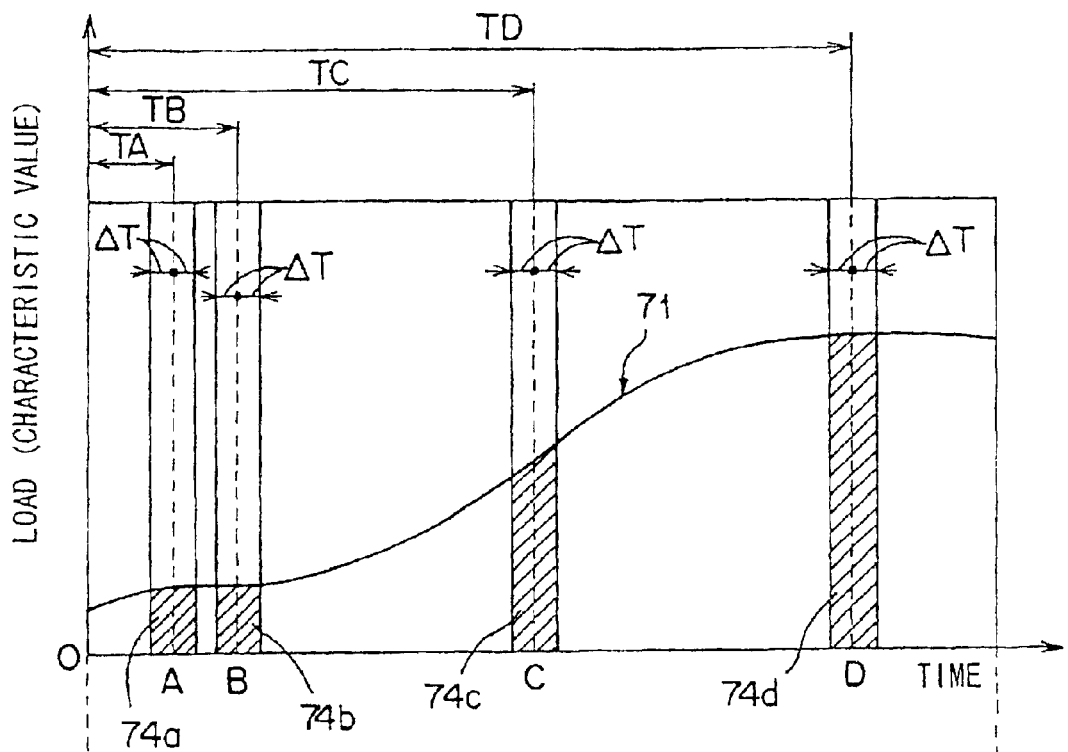
FIGS. 11A and 11B are graphs showing a reference waveform, singular points and second reference waveform segments in a third embodiment.

Now referring to FIGS. 11 and 12, an explanation will be given of a third embodiment of this invention. In FIGS. 11 and 12, like reference symbols refer to like portions in the first and second embodiments.

Figure 11B:
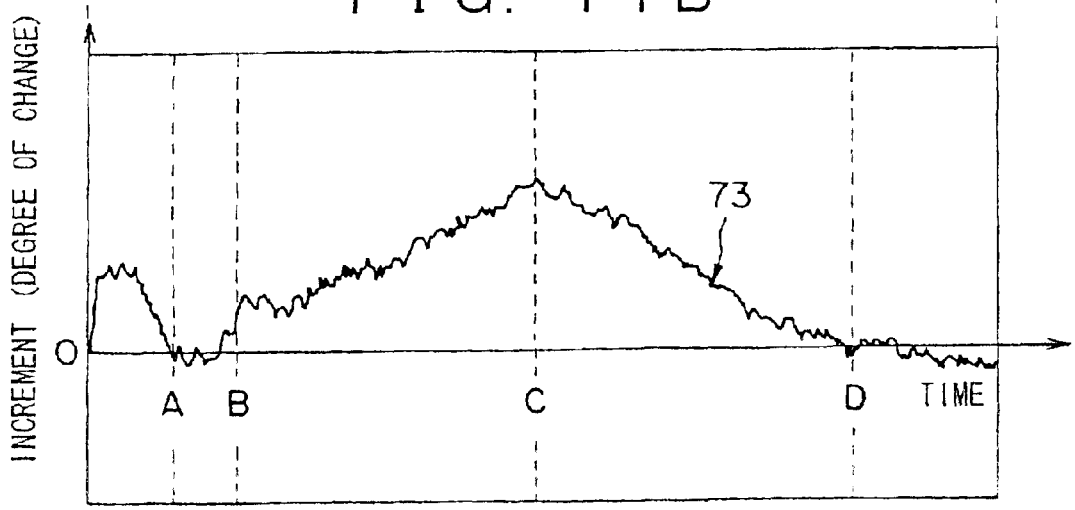

In this embodiment, unlike the first and second embodiments, the CPU 44, after having created the reference waveform 71, does not divide the reference waveform 71 into plural waveform segments. Like the first embodiment, the CPU 44 sets the singular points A, B, C and D from the reference waveform 71 as shown in FIG. 11B. The times TA, TB, TC and TD elapsed from the start of crimping are acquired. The areas over the period ΔT before and after each of the elapsed times TA, TB, TC and TD of the reference waveform 71 are set as second reference waveform segments 74a, 74b, 74c and 74d. The respective areas of the second reference waveform segments 74a, 74b, 74c and 74d are computed.

In order to decide whether the crimped state of the terminal is good or not, on the basis of the elapsed times TA, TB, TC and TD and the period ΔT, the second waveform segments 84a, 84b, 84c and 84d of the characteristic waveform 81 (illustrated in one-dot chain line in FIG. 12) obtained when the crimping terminal 51 is crimped on the electric wire 61 are acquired. These second waveform segments 84a, 84b, 84d and 84d correspond to the second reference waveform segments 74a, 74b, 74c and 74d, respectively. The second waveform segments 84a, 84b, 84c and 84d contain the areas corresponding to the singular points A, B, C and D.

Whether the crimping state is good or not is decided on the basis of the differences (shaded in FIG. 12A) between the second waveform segments 84a, 84b, 84c and 84d and the reference waveform segments 74a, 74b, 74c and 74d. In the decision, if all the differences are within a prescribed threshold value, it is decided that the electric wire at issue is a good product. If at least one difference exceeds the prescribed value, it is decided that the electric wire at issue is a poor product.

Figure 12A:
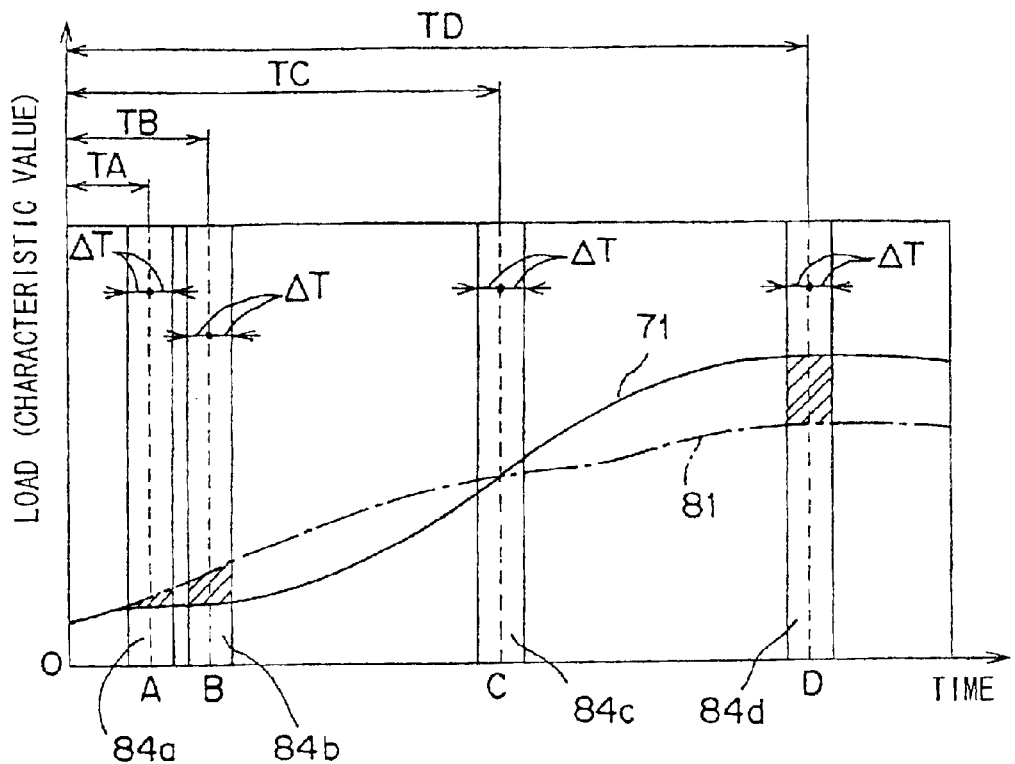
FIGS. 12A and 12B are graphs showing an relationship between the reference waveform and the characteristic waveforms corresponding to different poor states in the third embodiment.
Figure 12B:
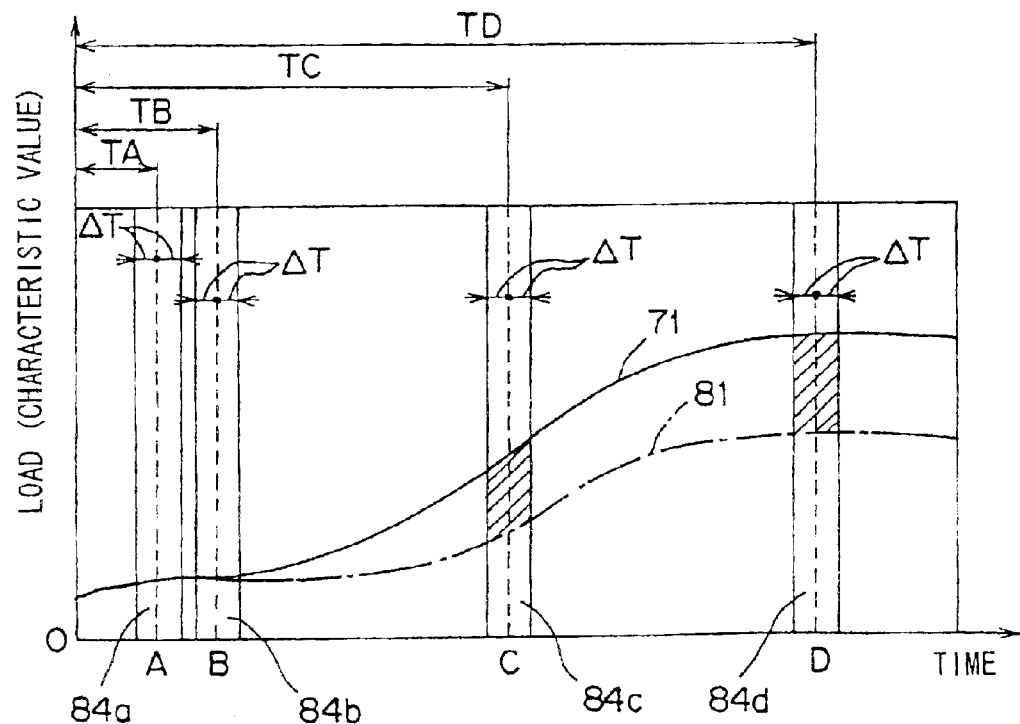

Incidentally, in FIG. 12A, the one-dot chain line represents the abnormal crimping (insulator catching) in which the coating 62 has been caught. In FIG. 12B, the one-dot chain line represents the abnormal crimping (shortage of the core) in which the core 60 has been cut at a scraped position or the amount of wire of the core 60 is less.

In this way, in accordance with the embodiment, whether the crimped state is good or not is decided on the basis of the second reference waveforms 74a, 74b, 74c and 74d containing the singular points A, B, C and D and the second waveform segments 84a, 84b, 84c and 84d containing the areas corresponding to the singular points A, B, C and D.

In this embodiment also, whether the crimped state is good or not is decided on the basis of the second waveform segments 84a, 84b, 84c and 84d which is part of the characteristic waveform 81 divided into plural segments. For this reason, the time taken for decision can be shortened.

In the course where the pair of core caulking legs 50 of the crimping terminal 51 are deformed by the R (curved portion) of the crimper 14, the singular point A is a point where the pair of core caulking legs 50 are brought into contact with each other. The singular point B is a point where the value of the load created when the pair of cores 50 start to touch the core 60 starts to rise. The singular point C is a point where in the course of caulking the core 60, the increment of the load turns from "rise" into "fall". The singular point is a point where the load has reached the peak (no load is applied). In order to decide whether the crimped state of the crimping terminal 51 is good or not, the reference waveform segments 72a, 72b, 72c and 72d containing the singular points A, B, C and D are used. Therefore, while the crimping terminal 51 is crimped, the load can vary at the singular points A, B, C and D and their vicinities according to whether the crimping is satisfactory or not so that the poor crimping can be surely and precisely.

In this embodiment, since whether the crimping state is good or not is decided on the basis of the second waveform segments 84a, 84b, 84c and 84d, in the case of the terminal where the load varies at the singular points A, B, C and D and their vicinities according to whether the crimping state is good or not, the poor crimping can be surely and precisely detected.

Embodiment 4

Figure 13A:
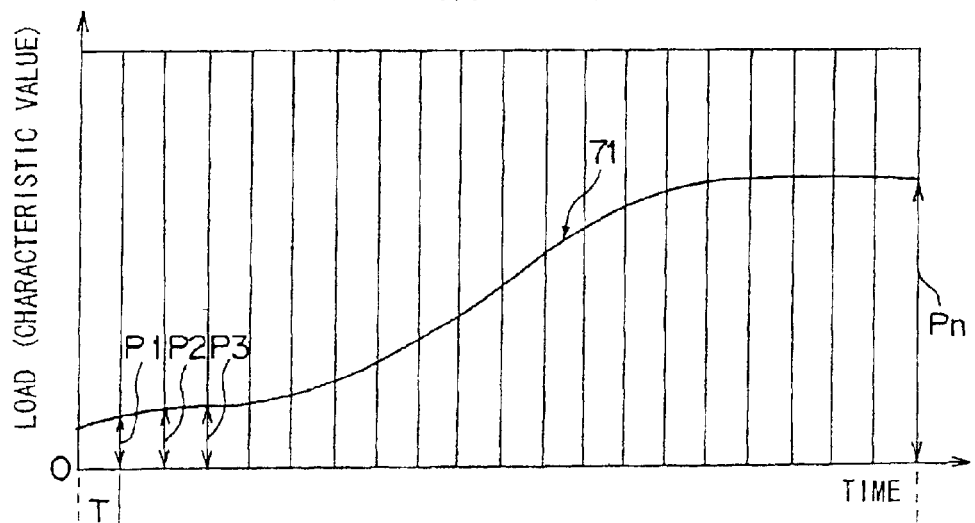
FIGS. 13A and 13B are views showing a reference waveform in the fourth embodiment in the fourth embodiment.
Figure 13B:
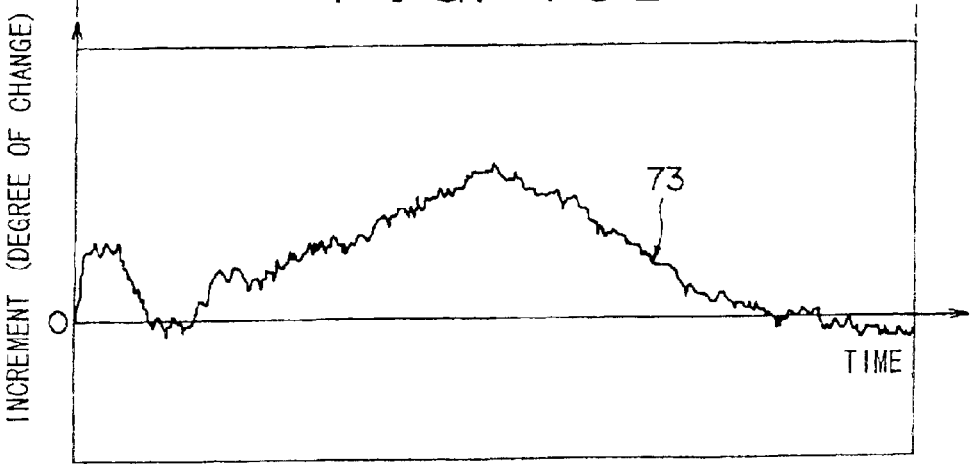

Referring to FIGS. 13 and 14, an explanation will be given of a fourth embodiment of this invention. In FIGS. 13, and 14, like reference symbols refer to like portions in the first to third embodiment.

In this embodiment, the CPU 44, after having created the reference waveform 71, divides it into fixed time periods T's without setting the singular points A, B, C and D. As shown in FIG. 13, the CPU 44 computes reference loads P1, P2, P3 . . . Pn as reference characteristic values for the time periods T's.

In order to decide whether the crimping state is good or not, the CPU 44 divides the characteristic curve (illustrated by one-dot chain line in FIG. 14) obtained when the crimping terminal 51 is crimped on the electric wire 61 into fixed time periods T's. The CPU 44 computes load values Pa1, Pa2, Pa3, . . . Pan, which are characteristic values for the fixed time periods T's.

Whether the crimping state is good or not is decided on the basis of the differences (symbols ΔP2, ΔP3, ΔP4, ΔP5, ΔP7, . . . ΔPn) between the reference load values P1, P2, P3, . . . , Pn of the reference waveform 71 and the load values Pa1, Pa2, Pa3, Pan of the characteristic curve 81. In the decision, if all the differences ΔP2, ΔP3, ΔP4, ΔP5, ΔP7, . . . ΔPn are within a prescribed threshold value, it is decided that the electric wire at issue is a good product. if at least one difference of ΔP2, ΔP3, ΔP4, ΔP5, ΔP7, . . . ΔPn exceeds the prescribed value, it is decided that the electric wire at issue is a poor product.

Figure 14A:
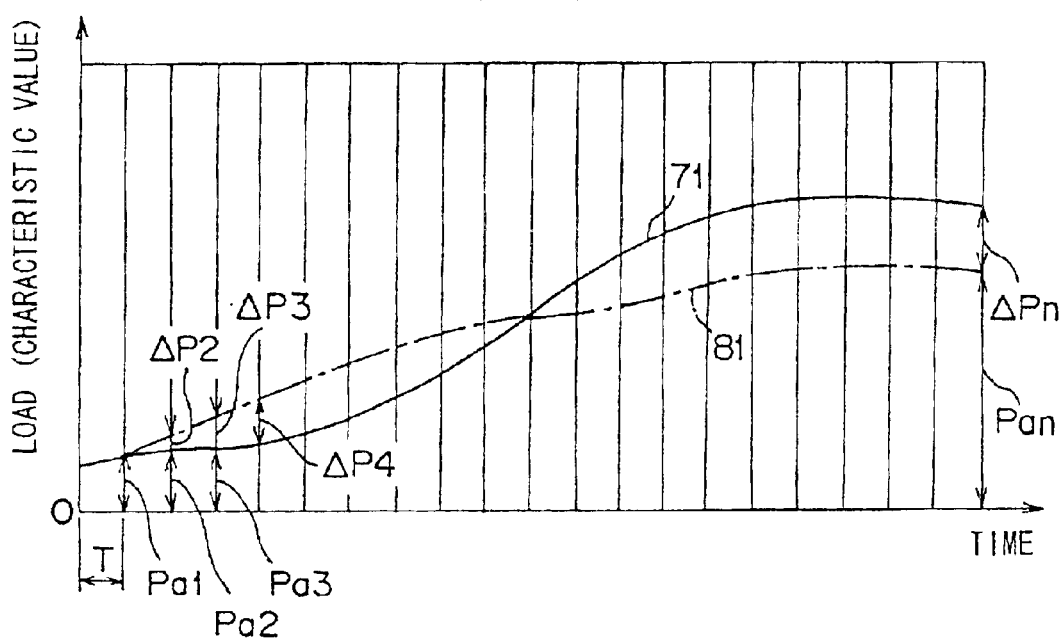
FIGS. 14A and 14B are graphs showing an relationship between the reference waveform and the characteristic waveforms corresponding to different poor states in the third embodiment.
Figure 14B:
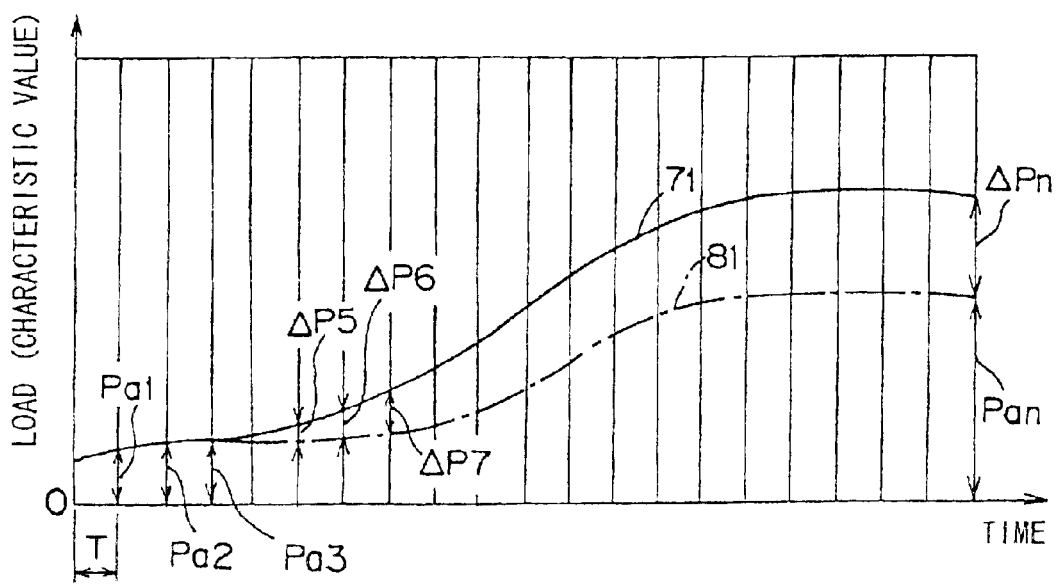

Incidentally, in FIG. 14A, the one-dot chain line represents the abnormal crimping (insulator catching) in which the coating 62 has been caught. In FIG. 14B, the one-dot chain line represents the abnormal crimping (shortage of the core) in which the core 60 has been cut at a scraped position or the amount of wire of the core 60 is less. In this way, in this embodiment, whether the crimping state is good or not is decided on the basis of the load values for the fixed time periods T's.

In this embodiment also, whether the crimping state is good or not is decided on the basis of the load values Pa1, Pa2, Pa3, . . . Pan which is part of the characteristic waveform 81. For this reason, the time taken for decision can be shortened.

Whether the crimping state is good or not is decided on the basis of the plural load values, i.e. the load values Pa1, Pa2, Pa3, . . . Pa4 for fixed time periods T's. For this reason, in the case of the abnormal crimping (insulator catching) in which the coating 62 has been caught, as shown in FIG. 14A and of the abnormal crimping (shortage of the core) in which the core 60 has been cut at a scraped position or the amount of wire of the core 60 is less, as shown in FIG. 14B, the poor crimping can be precisely detected.

In the fourth embodiment, the fixed time periods T's were set to be equal. However, as long as the reference waveform 71 is caused to correspond to the characteristic waveform 81, the load values at different fixed time periods may be adopted.

Figure 16:
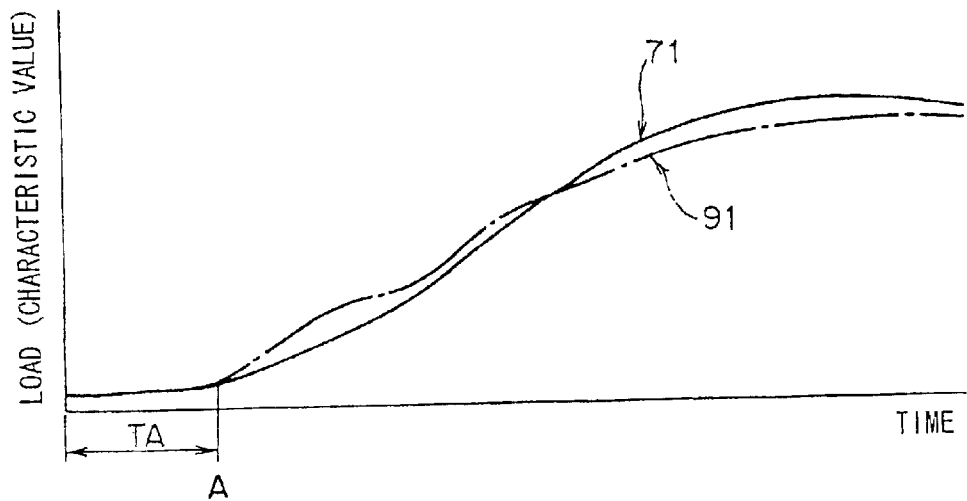
FIG. 16 is a view for explaining another technique for acquiring a singular point A in the first to third embodiments.

In the first to third embodiments, the singular points A and B may be defined as follows. First, as described above, the characteristic waveform (illustrated in solid line in FIG. 16) is created. A first poor waveform 91 (illustrated in one-dot chain line) in the poor crimping (insulator catching) in which the core 60 as well as the coating 62 has been caulked by the core caulking legs 50, is created.

The crimping operation proceeds with an elapse of time. The time TA elapsed from when the crimping is started to when the load (characteristic value) of the first poor waveform 91 starts to exceed the reference waveform 71 is acquired. The point terminated by the elapsed time TA is defined as a singular point (first singular point) A. In this case, since the pair of core caulking legs 50 are brought into contact with each other at the singular point A, the load (characteristic value) of the first poor waveform 91 starts to exceed the reference waveform 71. Therefore, the first singular point A can be surely defined on the basis of the load values of the first poor waveform 91 and the reference waveform 71. This permits the poor crimping to be detected precisely.

Figure 17:
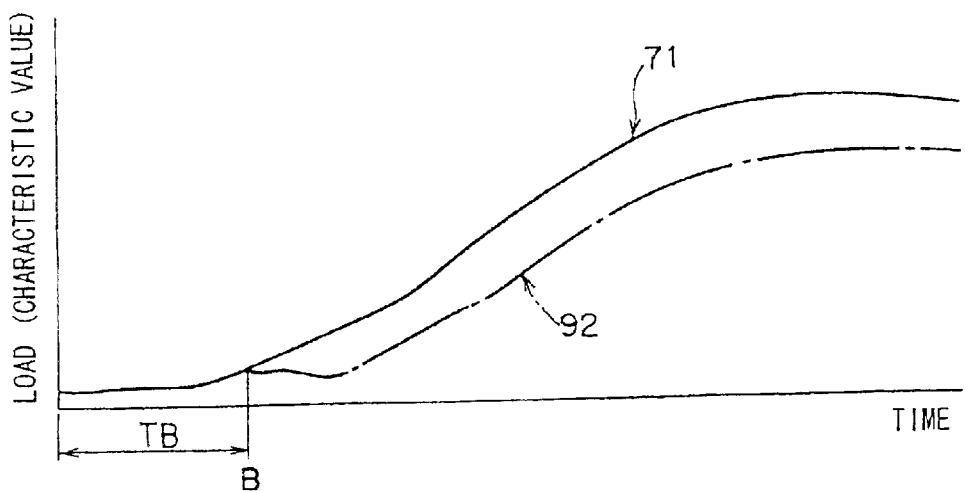
FIG. 17 is a view for explaining another technique for acquiring a singular point B in the first to third embodiments.

After the reference waveform 71 (illustrated in solid line in FIG. 17) has been created, a second poor waveform 92 (illustrated in one-dot chain line in FIG. 17) in the poor crimping (shortage of the core), in which the core 60 containing a smaller number of wires than in the normal crimping, is created. The time TB elapsed from when the crimping is started to when the load (characteristic value) of the second poor waveform 92 starts to fall short of the reference waveform 71 is acquired.

The point terminated by the elapsed time TB is defined as a singular point (second singular point) B. In this case, since the pair of core caulking legs 50 are brought into contact with each other at the singular point B, the load (characteristic value) of the second poor waveform 91 starts to exceed the reference waveform 71. Therefore, the second singular point B can be surely defined on the basis of the load values of the second poor waveform 92 and the reference waveform 71. This permits the poor crimping to be detected precisely.

The poor crimping detecting device 300 described above can be configured as a network system with the aid of the communication interface 48. For example, a plurality of terminal crimping apparatus 300 attached to a plurality of terminal crimping devices 200 are connected to a portable computer through a network. The data of the reference waveform 71 set by each of the poor crimping detecting devices 300 is supplied to the portable computer, and stored in the hard disk incorporated in the portable computer. The reference waveform 71 in each of the poor crimping detecting devices 300 is managed.

In the embodiments described above, as the characteristic value during the crimping, the load conducted from the crimper holder 15 to the ram 11 was detected. However, the pressure (load) applied to the anvil 17 or stress conducted from the crimper 14 to the crimper holder and applied to the ram 11, which can be detected by the pressure sensor 100, may be used as a characteristic value.

An amount of elastic deformation of an elastic deforming portion, which can be previously formed at a part of the ram 11, may be used as a characteristic value. In this case, a probe of a displacement sensor is preferably arranged in contact with the elastic deforming portion. The displacement sensor may be provided between the side plates 3 of the frame 1.

Specifically, in the terminal crimping apparatus 200 for crimping the crimping terminal 51, the frame 1 is deformed in receipt of counter force during the crimping. The amount of deformation differs according to a kind of the terminal crimping apparatus 200. This is because a different structure of the frame provides different rigidity. Some terminal crimping apparatus give large deformation of the frame and some terminal crimping apparatus give small deformation of the frame. A terminal crimping apparatus giving substantially zero deformation can be supposed but is not practical.

Thus, the terminal crimping apparatus 200 actually employed is basically deformed. This amount of deformation can be used as a characteristic value. Thus, by measuring not only the amount of deformation of the frame 1 but also providing a recess in the piston-crank mechanism which facilitate deformation like the ram, the displacement sensor can be incorporated in the terminal crimping apparatus 200.

An accelerating sensor may be employed in place of the displacement sensor. In this case, the accelerating sensor measures the process of the deformation of the frame 1. The characteristic waveform 81 during the crimping is acquired from the measured value, thereby providing the data sufficient to discriminate the good product from the poor product.

Figure 5B:
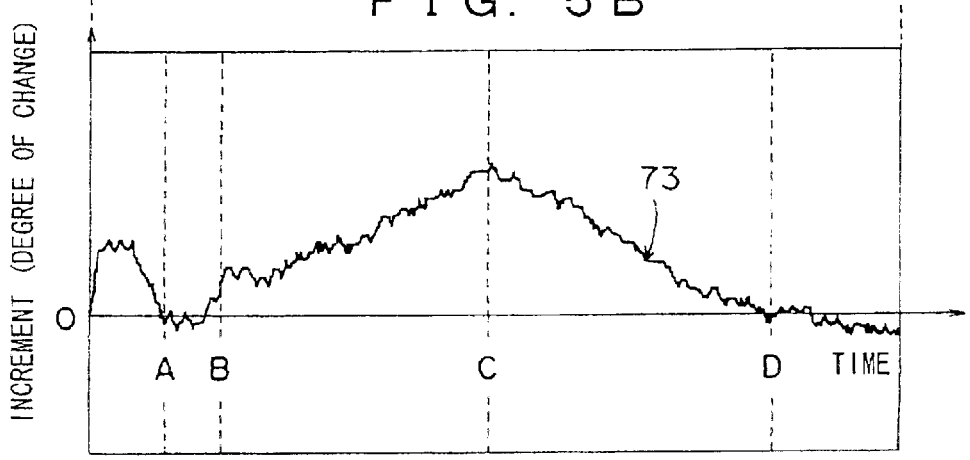

The sensor may produce a characteristic value in a different manner according to its kind, thus providing a different waveform of the increments from that of FIG. 5B. In this case also, using the zero-crossing point and a peak point of the characteristic value, the singular points A, B, C and D can be acquired as particular points in a single cycle of the same crimping process as shown in FIG. 6.

In the embodiments described above, the terminal crimping device 200 which crimps the crimping terminal 51 by driving the servo motor was employed. However, it is needless to say that this invention is applicable to any crimping mechanism.

The embodiments described above are directed to the case where the singular points A, B, C and D were exhibited relatively clearly. However, this invention can deal with the case where the singular points A, B, C and D are not exhibited clearly. In this case, the characteristic waveform 71 in the case where the crimped state of the terminal is good is compared with the characteristic waveform 81 in the case where the crimping state is poor, and the segments with larger integrated values are used as the reference waveform segments 72a, 72b, 72c, 72d, 72e, 72f, 74a, 74b, 74c and 74d In the first embodiment, the reference waveform segments 72a, 72b, 72c and 72d containing the singular points A, B, C and D were employed. In the second embodiment, the reference waveform segments 72e and 72f not containing the singular points A, B, C and D were employed. However, in accordance with this invention, as long as the reference waveform 71 and characteristic waveform 81 are not employed in their entirety, the reference waveform segment and characteristic waveform segment may be suitably selected from the waveform segments of the reference waveform 71 and characteristic waveform 81 according to the crimping terminal 51 and the electric wire 61. Further, also in the case where there are four singular points of A, B, C and D, as long as the load values are remarkably different according to the crimping state, in accordance with this invention, e.g. three waveform segments may be employed.

What is claimed is:

1. A method for testing the crimped state of a test terminal on the basis of a waveform of characteristic values obtained in the process of crimping the test terminal on a core of an electric wire, comprising the steps of:

acquiring a reference waveform from a characteristic waveform when a first terminal has been crimped normally, and dividing the reference waveform into first plural reference waveform segments, the reference waveform showing changes in load at regular time intervals when the first terminal is crimped normally, each of the first plural reference waveform segments corresponding to a segment of time elapsed when the first terminal is crimped normally;

dividing the waveform obtained when the test terminal is crimped on the electric wire into second plural waveform segments corresponding to those of the reference waveform; and deciding whether or not the crimped state of the test terminal is good on the basis of the first reference waveform segments of the reference waveform and the second waveform segments of the waveform obtained when the test terminal is crimped.

2. The method of testing the crimped state of a test terminal according to claim 1, wherein singular points of the reference waveform are previously acquired on the basis of increments of the reference waveform; and said first reference waveform segments contain said singular points.

3. The method of testing the crimped state of a test terminal according to claim 2, wherein said singular points are points where the increments of said reference waveform correspond to at least one selected from among a maximum change in load per unit time and a zero change in load per unit time.

4. The method of testing the crimped state of a test terminal according to claim 2, wherein said electric wire has a coating for coating said core, said test terminal has caulking legs for caulking said core, a first poorness waveform is acquired from the waveform obtained when the test terminal is crimped when said caulking legs caulk said coating as well as said core, and a first singular point of said singular points is acquired from said reference waveform and said first poorness waveform.

5. The method of testing the crimped state of a test terminal according to claim 4, wherein said first singular point is defined by a point where a characteristic value of said first poorness waveform exceeds that of said reference waveform as the time of the crimping of the test terminal elapses.

6. The method of testing the crimped state of a test terminal according to claim 2, wherein said core is composed of a plurality of conductors tied up in a bundle;

said test terminal has caulking legs for caulking said core;

a second poorness waveform is acquired from the waveform obtained when the test terminal is crimped when said caulking legs caulk conductors whose number is smaller than that when the first terminal has been normally crimped; and a second singular point is acquired from said reference waveform and said second poorness waveform.

7. The method of testing the crimped state of a test terminal according to claim 6, wherein said second singular point is defined by a point where a characteristic value of said second poorness waveform falls below that of said reference waveform as the time of the crimping of the test terminal elapses.

8. The method of testing the crimped state of a test terminal according to claim 1, wherein singular points of the reference waveform are previously acquired on the basis of increments of the reference waveform; and said first reference waveform segments are located between the singular points.

9. A method for testing the crimped state of a test terminal on the basis of a waveform of characteristic values obtained in the process of crimping the test terminal on a core of an electric wire, comprising the steps of:

acquiring a reference waveform from a characteristic waveform when a first terminal has been crimped normally, the reference waveform showing changes in load at regular time intervals when the first terminal is crimped normally;

acquiring singular points of the reference waveform on the basis of increments thereof, the increments corresponding at least to a maximum change in load per unit time and a zero change in load per unit time;

acquiring first reference waveform segments which are segments containing the singular points;

acquiring second waveform segments containing points corresponding to said singular points in the waveform obtained when the test terminal has been crimped on the electric wire; and deciding whether or not the crimped state of the test terminal is good on the basis of said first reference waveform segments and said second waveform segments.

10. A method for testing the crimped state of a test terminal on the basis of a waveform of characteristic values obtained in the process of crimping the test terminal on a core of an electric wire, comprising the steps of:

acquiring a reference waveform from a characteristic waveform when a first terminal has been crimped normally, and acquiring reference characteristic values at regular intervals of the reference waveform, the reference waveform showing changes in load at regular time intervals when the first terminal is crimped normally;

acquiring characteristic values of the waveform obtained when the test terminal has been crimped on the electric wire, at said regular intervals; and deciding whether or not the crimped state of the test terminal is good on the basis of said reference characteristic values and the characteristic values of the waveform obtained when the test terminal has been crimped.

* * * * *